(12) United States Patent
Takano et al.

(10) Patent No.: US 6,797,110 B2
(45) Date of Patent: Sep. 28, 2004

(54) GLASS, PLASMA RESISTING COMPONENT, COMPONENT FOR ELECTROMAGNETIC WAVE-TRANSPARENT WINDOW AND PLASMA PROCESSING APPARATUS

(75) Inventors: Yuichi Takano, Nishinomiya (JP); Koichi Terao, Osaka (JP)

(73) Assignee: Tokyo Electron Limited, Tokyo (JP)

( * ) Notice: Subject to any disclaimer, the term of this patent is extended or adjusted under 35 U.S.C. 154(b) by 137 days.

(21) Appl. No.: 09/811,465

(22) Filed: Mar. 20, 2001

(65) Prior Publication Data

US 2002/0049127 A1 Apr. 25, 2002

(30) Foreign Application Priority Data

Mar. 21, 2000 (JP) ........................................ 2000-078950

(51) Int. Cl.$^7$ ............................ H05H 1/00; C23C 16/00
(52) U.S. Cl. ............................ 156/345.41; 156/345.48; 118/723 MW; 118/723.1
(58) Field of Search ..................... 156/345.47, 345.48, 156/345.41; 118/723 MW, 723 I; 501/55, 32, 54, 68; 11/11

(56) References Cited

U.S. PATENT DOCUMENTS

| | | | | |
|---|---|---|---|---|
| 4,009,042 A | * | 2/1977 | Rittler | 501/4 |
| 4,266,978 A | * | 5/1981 | Prochazka | 501/1 |
| 4,427,785 A | * | 1/1984 | Prochazka et al. | 501/128 |
| 5,637,358 A | * | 6/1997 | Otoshi et al. | 427/575 |
| 6,277,251 B1 | * | 8/2001 | Hwang et al. | 204/192.33 |
| 6,290,807 B1 | * | 9/2001 | Matsumoto et al. | 156/345.41 |
| 6,358,361 B1 | * | 3/2002 | Matsumoto | 156/345.41 |
| 6,497,783 B1 | * | 12/2002 | Suzuki et al. | 156/345.41 |

FOREIGN PATENT DOCUMENTS

| | | |
|---|---|---|
| JP | 04-356922 | 12/1992 |
| JP | 10-045467 | 2/1998 |
| JP | 10-214823 | 8/1998 |
| JP | 11-228172 | 8/1999 |

* cited by examiner

*Primary Examiner*—Parviz Hassanzadeh
(74) *Attorney, Agent, or Firm*—Finnegan, Henderson, Farabow, Garrett & Dunner, LLP

(57) ABSTRACT

A glass material for use in a microwave-transparent window of a plasma processing apparatus is provided. The glass material has not only good properties similar to those of quartz glass but a corrosion resistance particularly to fluorine-containing plasma. The glass having the corrosion resistance to the fluorine-containing plasma is composed of a first glass phase consisting of Si and O and a second glass phase consisting of Si, Al and O. The second glass phase has a mass ratio of Al to Si of at least 0.01. The glass member is useful as a component for forming an electromagnetic-wave introducing window of the plasma processing apparatus or the like.

4 Claims, 5 Drawing Sheets

GLASS, PLASMA RESISTING COMPONENT, COMPONENT FOR ELECTROMAGNETIC WAVE-TRANSPARENT WINDOW AND PLASMA PROCESSING APPARATUS

BACKGROUND OF THE INVENTION

1. Field of the Invention

The present invention relates to a glass, a component made of the glass and a plasma processing apparatus incorporating the component, and more particularly, to an Al-containing glass having a plasma resistance, a component for an electromagnetic wave-transparent window made of the glass, and a plasma processing apparatus incorporating the component.

2. Description of the Background Art

In the process of manufacturing LSI, LCD or the like, plasma that is generated by externally applying energy to reaction gas is widely used for etching, CVD and the like. In particular, the use of the plasma has been an essential technique in the process of etching. Now, increase in the size of the substrate to be processed with the plasma has been required that the plasma should uniformly be generated over a wider region.

FIGS. 1 and 2 show an example of the apparatus for such a plasma processing. The plasma processing apparatus shown in FIG. 1 has a rectangular parallelepiped-shaped reactor 31, which is entirely formed of aluminum. An upper opening of reactor 31 is sealed with a plate 34 such that reactor 31 is maintained gas-tight. Plate 34 is formed of a heat-resistant and microwave-transparent material with a small dielectric loss, e.g. quartz glass ($SiO_2$). The upper part of reactor 31 is covered with a rectangular parallelepiped-shaped cover component 40. A dielectric line 41 is attached to the inside ceiling portion of cover component 40. Dielectric line 41 is made of a dielectric material such as a fluororesin e.g. Teflon®, a polyethylene resin, a polystyrene resin or the like. Dielectric line 41 has a plate-shaped portion 41b and a tapered portion 41a that is an extension from the end of plate-shaped portion 41b and has an increased thickness. Tapered portion 41a is fit into a waveguide 51 connected to cover component 40. A microwave oscillator 50 is connected to waveguide 51. Microwave from microwave oscillator 50 is introduced into tapered portion 41a of dielectric line 41 via waveguide 51. The microwave is extended at tapered portion 41a and is propagated across the entire dielectric line 41. The microwave is reflected at the end surface of cover component 40, which is opposed to waveguide 51, and then the incident wave and the reflected wave are combined with each other, resulting in a standing wave in dielectric line 41. A gas introducing tube 35 is inserted into a wall of reactor 31 defining a processing chamber 32. A stage 33 is provided at the center of the bottom of processing chamber 32, on which a sample W is placed. Stage 33 is connected to a RF power-supply 37 of several hundreds kHz to ten and several MHz via a matching box 36. An exhaust vent 38 is provided at the side portion of the bottom of reactor 31.

In the plasma processing apparatus, the surface of sample W is processed by etching as described below. Processing chamber 32 is evacuated through exhaust vent 38 so that the pressure therein is reduced to a desired pressure, and reaction gas is then supplied from gas introducing tube 35 into processing chamber 32. Subsequently, microwave oscillator 50 oscillates microwave, which is introduced into dielectric line 41 via waveguide 51. At that time, the microwave evenly extends in dielectric line 41 by tapered portion 41a, resulting in a standing wave. The standing wave forms a leakage electric field at a lower part of dielectric line 41. The wave passes through plate 34 and enters processing chamber 32. In processing chamber 32 containing the reaction gas, plasma is generated by the microwave propagated into chamber 32. A radio frequency is applied from RF power-supply 37 through matching box 36 to stand 33, so that the surface of sample W is etched. Even if the apparatus has a large diameter of reactor 31 for the process of a large size of sample W, the microwave can be introduced uniformly into the entire region of reaction chamber 31, so that sample W can be subjected to relatively uniform plasma processing.

In addition to the essential performances of etching and film-forming, the plasma processing apparatus is also required to have some characteristics such as low contamination, reduced particles, long lives of consumable components, low operational cost and easy maintenance. In order to satisfy such characteristics, quartz glass, aluminum, alumina, stainless steel or the like is selected to conform the requirement for the materials of the components constituting the reactor and the internal structure thereof. The quartz glass is useful, among such materials, for the insulating component with low contamination and reduced particle release. For example, in the plasma processing apparatus described above, plate 34 that closes the opening of reactor 31 and separates the microwave-supplying portion from reactor 31 functions as a window for introducing microwave into processing chamber 32, and such a window has been conventionally made of quartz glass.

However, the quartz glass having good properties as mentioned above easily reacts with fluorine-containing plasma to form $SiF_4$. $SiF_4$ has a low boiling point and is easily vaporized, so that the quartz glass is rapidly etched in the fluorine-containing plasma and hence is worn away. Because the high purity quartz glass used in the process of LSI is expensive, such heavy abrasion would be a factor of a high manufacturing cost. Such heavy abrasion would also increase the frequency of changing the components and the time for such replacement may form a considerable part of the whole manufacturing time. As a result, the processing efficiency may be decreased and the manufacturing cost increased.

As a solution of the problem, Japanese Patent Application No. 4-356922 discloses a component for an electro-discharge and plasma process, which is made of high-purity polycrystalline alumina or high-purity monocrystalline alumina. This component has a microwave-transparent property and a resistance to the plasma derived from $CF_4+O_2$ gas.

However, when the alumina component as disclosed in the above publication is used as a microwave-introducing window in the electro-discharge and plasma process, the etching rate may be lowered, or the microwave-introducing window may be damaged due to the distortion of the alumina caused by heat. The inventors of the present invention have investigated the cause of the lowered plasma-processing rate among the problems associated with the use of the alumina microwave-introducing window. As a result, it has been found that the dielectric loss of the alumina is increased (whereas the Q value is decreased) as the temperature of the microwave-introducing window is increased during the plasma processing, so that the transparency to the microwave is reduced, causing the lowered plasma processing rate. It has also been found that a great thermal stress is generated in the alumina plate at a high temperature or with a wide distribution of temperature, resulting in cracks, because of the thermal expansion coefficient of the alumina plate larger than that of quartz glass. Additionally, ceramics such as alumina may contain a sintering agent to aid the formation of the sintered body. Such a sintering agent may constitute a factor in contamination.

SUMMARY OF THE INVENTION

Thus, the present invention is directed to solve the problems described above, and an object of the present invention is to provide a new material having a good plasma resistance.

Particularly, the present invention is directed to solve the problems associated with quartz glass, and another object of the present invention is to provide a component which has not only good properties similar to those of the quartz glass but also a corrosion resistance to plasma especially containing fluorine.

Yet another object of the present invention is to provide an application of the material having such a plasma resistance, and to provide a plasma processing apparatus incorporating a component made of such a material.

Still another object of the present invention is to provide a component of a plasma processing apparatus, having: electromagnetic-wave transparency suitable for generating plasma of high density; plasma etching resistance that is lacking in quartz glass; and a long life and crack resistance which are lacking in alumina, and to provide a plasma processing apparatus incorporating the component made of such a material.

According to the present invention, a new glass material is provided, which comprises a first glass phase consisting essentially of Si and O, and a second glass phase consisting essentially of Si, Al and O, wherein the second glass phase has a mass ratio of Al to Si of at least 0.01.

According to the present invention, is provided a plasma-resistant component made of the glass. Moreover, the present invention is also directed to a component for an electromagnetic wave-transparent window, which is made of the glass and is for use in constituting a window transparent to the electromagnetic wave.

Furthermore, the present invention is directed to a plasma processing apparatus that is for use in a process with plasma generated by using an electromagnetic wave. In the apparatus, a component made of the glass defined above is used as a component that is transparent to the electromagnetic wave so as to introduce the electromagnetic wave into a chamber where plasma is generated.

According to the present invention, a plasma processing apparatus includes: a reaction vessel which can be evacuated; a means for supplying a high-frequency electric power or electromagnetic wave into the reaction vessel; a means for supplying gas into the reaction vessel; and a sample stage on which a material to be processed is placed within the reaction vessel, wherein at least a part of the member to be in contact with plasma generated in the reaction vessel by the high-frequency electric power or electromagnetic wave is made of the glass defined above.

According to the present invention, another plasma processing apparatus includes: a reaction vessel which has an opening sealed with a sealing component and can be evacuated; a means for supplying a high frequency electric power or electromagnetic wave into the reaction vessel via the sealing component; a means for supplying gas into the reaction vessel; and a sample stage on which a material to be processed is placed within the reaction chamber, wherein the sealing component is made of the glass defined above.

The apparatus according to the present invention is especially useful as a plasma processing apparatus in which plasma is generated from gas containing fluorine. Moreover, the component according to the present invention is especially useful for the applications that are exposed to the plasma generated from the fluorine-containing gas.

DESCRIPTION OF THE PREFERRED EMBODIMENTS

The glass according to the present invention can be produced by a melting method. In such a process, for example, quartz powder is mixed with powder of aluminum-containing oxide such as alumina ($Al_2O_3$) or mullite ($3Al_2O_3.2SiO_2$), the mixture is heated to a temperature of 2000° C. or higher so that it is completely melt to give a homogeneous melt, and then, the melt is cooled into solid. The heating temperature is at least 2000° C., and more preferably, at least 2050° C. The heating may be carried out by oxyhydrogen flame (an oxyhydrogen-flame melting method) or by an electric furnace (an electric melting method). The amount of the aluminum-containing oxide to be added is set in such a manner that the mass ratio of Al to Si will be 0.01 or greater in the glass phase consisting essentially of Si, Al and O, which will be generated finally. Specifically, 0.1 to 10 parts by weight, more preferably, 1 to 5 parts by weight of the aluminum-containing oxide powder is added to 100 parts by weight of quartz powder. The quartz powder employed has a high purity, typically a purity of at least 99.9%, more preferably, at least 99.99%. The mixture is heated to 2000° C. or higher to be melted and then cooled into solid, as described above, resulting in a glass composed of a first glass phase consisting essentially of Si and O and a second glass phase consisting essentially of Si, Al and O. The glass may be machined into a component having a desired shape.

Figure 3:
FIG. 3 is an electron micrograph showing a microstructure of the glass according to the present invention.

FIG. 3 shows an example of the structure of the glass according to the present invention, which is obtained by the observation with a scanning electron microscope. The glass structure observed has a dark-colored portion and a light-colored portion. As regards the glass according to the present invention, the dark-colored portion corresponds to the first glass phase consisting essentially of Si and O, whereas the light-colored portion corresponds to the glass phase consisting essentially of Si, Al and O. Generally, the glass according to the present invention has a structure in which the first glass phase is dispersed in the second glass phase. The first glass phase is substantially evenly dispersed in the second glass phase that is a continuous phase. The average diameter of the particles of the first glass phase dispersed in the second glass phase is generally 100 to 500 μm. The first glass phase consisting essentially of Si and O forms a quartz glass phase having a composition of $SiO_2$. The second glass phase consisting essentially of Si, Al and O has a network structure in which Al is incorporated in the network that forms glass. The second glass phase has an Al—O bond and an Al—O—Si bond. Such a structure composed of the first glass phase and the second glass phase can be obtained by heating a raw material at a temperature of 2000° C. or higher. In contrast, a heating temperature lower than the above temperature (for example, 1700 to 1900° C.) cannot produce such a structure.

The inventors have found that the glass having the microstructure as described above has a preferable plasma resistance. The etching mechanism of the plasma generated from halogen-based (in particular, F-based) reaction gas includes two stages: the first stage in which a halogen-based reaction product is generated; and the second stage in which the halogen-based reaction product vaporizes or remains. If in the material, a larger part of the halogen-based reaction product generated in the first stage can remain in the second stage, such a material will have a higher plasma resistance. As regards the conventional quartz glass, when the quartz glass component is irradiated with the plasma generated from the F-based reaction gas, silicon fluoride ($SiF_4$) is generated at the first stage and the $SiF_4$ is easily vaporized at the second stage. Therefore, the conventional quartz glass has a low resistance to the plasma. In the case of the glass according to the present invention, because it has the second glass phase consisting essentially of Si, Al and O as described above in the microstructure, aluminum fluoride such as. $AlF_3$ is generated in the first stage in addition to $SiF_4$. In the second stage, $SiF_4$ easily vaporizes while $AlF_3$ remains on the surface, since the vapor pressure of $AlF_3$ is lower than that of $SiF_4$. Therefore, the glass according to the present invention has a higher resistance to plasma that contains halogen (particularly F).

The plasma resistance can be attained when the mass ratio of Al to Si (Al/Si) is 0.01 or higher in the second glass phase of the glass according to the present invention. If Al/Si is lower than 0.01, the amount of $AlF_3$ generated is so small that no increase can be seen in the resistance to plasma. The mass ratio Al/Si is typically 0.01 or higher, and more preferably, 0.2 or higher. Additionally, in an optical micrograph or an electron micrograph showing a section of the glass structure according to the present invention, the percentage of the area of the second glass phase (the area percentage of the second glass phase to the entire area of the glass) is preferably 20% or higher for the resistance. If the area percentage is lower than 20%, the part of the component etched by the plasma may be increased because of a higher percentage of the first glass phase of Si and O with a low resistance.

When the glass according to the present invention is used as a microwave-transparent window such as a sealing material for a reaction vessel, the fQ value of the microwave transparency is preferably 20,000 or greater. If the fQ value is smaller than 20,000, the microwave can be absorbed by the component, so that the plasma can be generated at an insufficient density, or the plasma might unevenly be generated in the apparatus. Here, the fQ value is a product of a frequency f (Hz) and a Q value that is an inverse of a dielectric loss (tan δ) at the frequency.

The glass according to the present invention has a thermal expansion coefficient significantly smaller than that of alumina. Unlike alumina, the glass according to the present invention will not suffer from cracks for thermal stress in the component of the microwave-introducing window.

The glass according to the present invention can be used for various purposes. In particular, the present invention is directed to a plasma-resistant glass member. Such a member includes a component of a plasma processing apparatus, such as the microwave-introducing window as described above. The present invention will be described in more detail by the examples below, but the present invention is not limited to the examples.

EXAMPLES

Preparation of Glass

A glass according to the present invention is prepared by the process described below.

A mixture of quartz powder with a purity of 99.99% and alumina ($Al_2O_3$) powder was placed in a melting furnace and heated at a temperature of 2050° C. or higher by oxyhydrogen flame. The raw material was completely melted into a homogeneous state, and then cooled into solid. The obtained glass was machined into a component having a desired shape. Various glasses were prepared by changing the amount of the alumina to be added.

The microstructure of the glass prepared by the process described above was observed as follows. A small piece was cut out from the prepared glass and the surface thereof was mirror-polished. The surface was then washed with an acid mixture containing hydrofluoric acid and nitric acid. The washed surface was observed by a scanning electron microscope. As a result, the structure as shown in FIG. 3 was observed, which has a light portion and a dark portion of the surface. The composition of each portion was examined by an energy-dispersive X-ray spectrometry. As a result, it was found that the dark portion is composed of Si and O, and the light portion is composed of Si, Al and O.

The various glasses prepared were subjected to a quantitative analysis by the energy-dispersive X-ray spectrometry, so that each mass ratio of Al to Si (Al/Si) in the second glass phase composed of Si, Al and O was determined by using a calibration curve. In order to make the calibration curve, quartz glass whose composition had previously determined, a sintered body of mullite ($3Al_2O_3.2SiO_2$), a sintered body of $Al_2O_3$, a sintered body of cordierite ($2MgO.2Al_2O_3.5SiO_2$), and a sintered body of sapphirine ($4MgO.5Al_2O_3.2SiO_2$) were used as standard samples. Then, the concentrations of Si and Al elements in the second glass phase of each sample were obtained in mass percentages by using the peak intensities of the Kα curve and the calibration curve, and then Al/Si ratios were obtained. The sample as shown in FIG. 3 has an Al/Si ratio of 0.3. Moreover, the electron micrograph was used to obtain the percentage of the area of the light portion, i.e. the second glass phase, in a certain region. The obtained percentage was defined as the amount ratio of the second glass phase.

For comparison purposes, a raw material of quartz powder mixed with a certain amount of alumina ($Al_2O_3$) powder was heated at 1900° C. by oxyhydrogen flame to give a melt. The melt was then cooled into solid, resulting in a glass. The microstructure of the obtained glass was observed by the method described above. As a result, a large amount of alumina was observed, which was considered as the product of incomplete melting. Also, micro cracks were observed that possibly occurred at the time of cooling due to the difference in the linear expansion coefficient between the quartz glass and the alumina. Such micro cracks are undesirable from a practical standpoint, since they degrade the mechanical properties. Furthermore, no two-phase structure composed of the first glass phase of Si and O and the second glass phase of Si, Al and O was observed in the microstructure of the obtained glass.

Plasma Processing Apparatus

Figure 4:
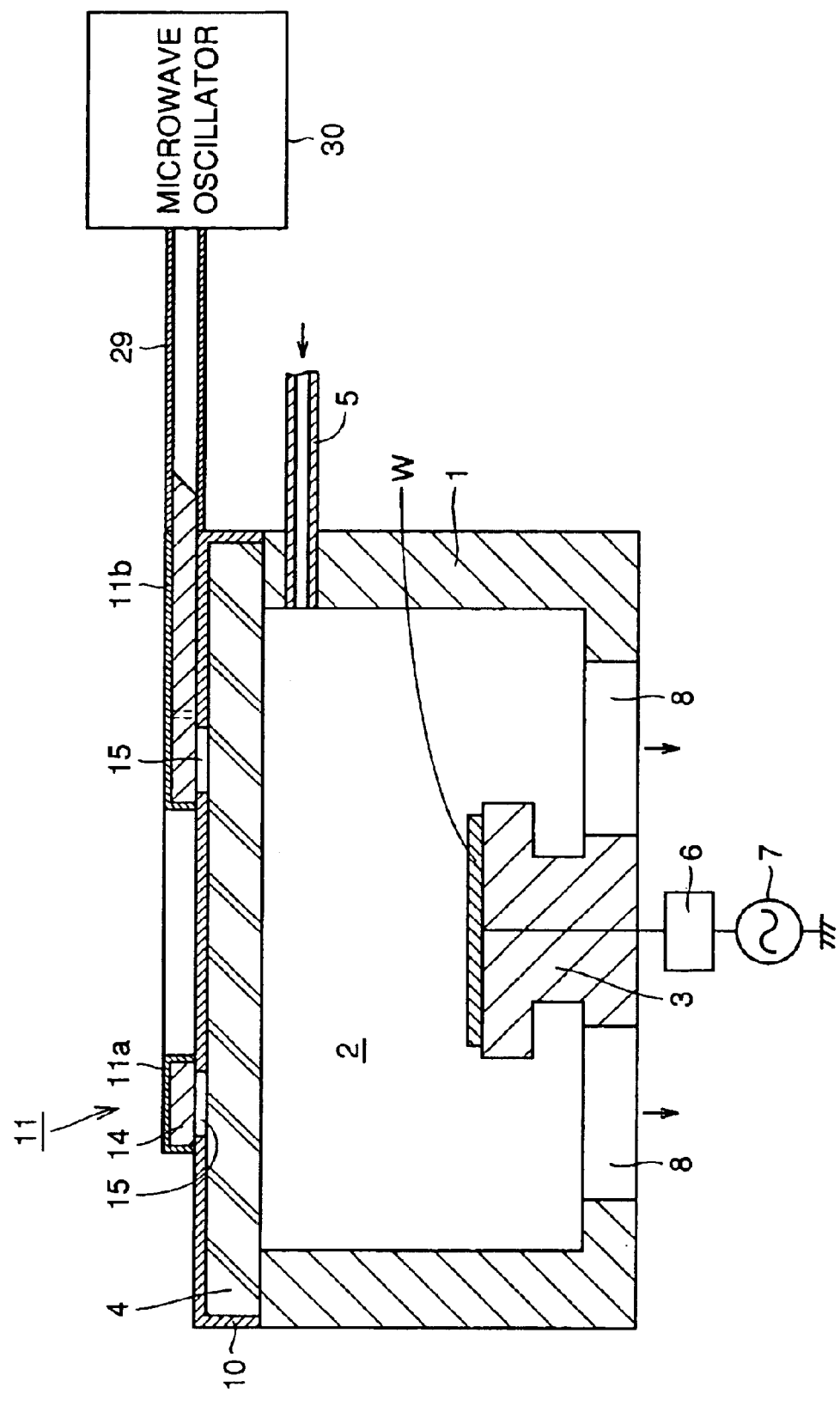
FIG. 4 is a schematic section view showing an example of the plasma processing apparatus according to the present invention.
Figure 5:
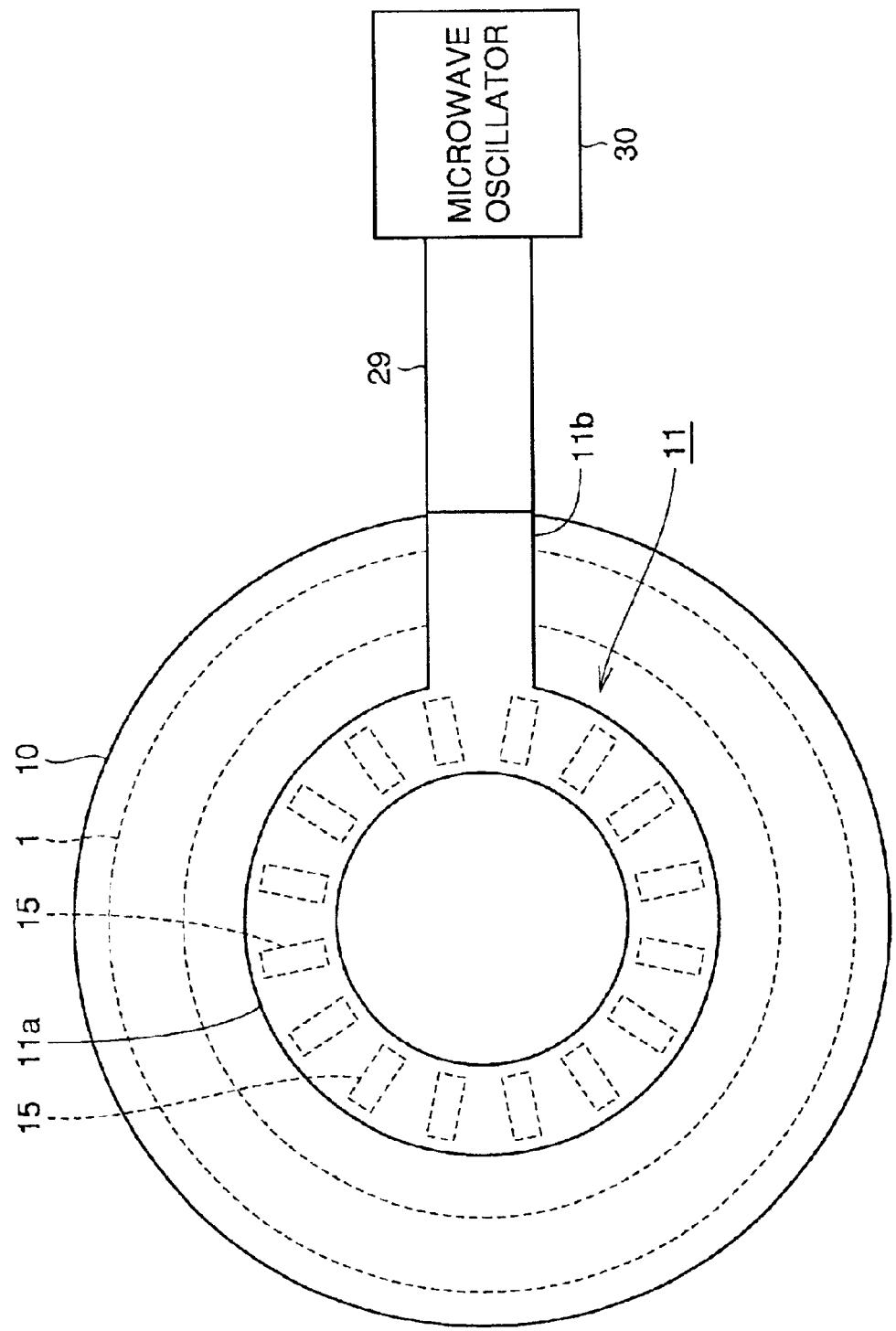
FIG. 5 is a schematic plan view of the apparatus shown in FIG. 4.

The obtained glass member according to the present invention was used as a microwave-introducing window to constitute a plasma processing apparatus described below. FIG. 4 is a side section view showing the structure of a plasma processing apparatus according to the present invention. FIG. 5 is a plan view of the plasma processing apparatus shown in FIG. 4.

A reactor 1 whose whole body is made of aluminum has a cylindrical shape and defines a bottom at one end. The upper opening of reactor 1 is airtightly sealed with a sealing plate 4 as described below. The outside of sealing plate 4 is fit into a cover component 10, which is fixed on reactor 1. An antenna 11 for introducing microwave into reactor 1 is fixed on the top surface of cover component 10. Antenna 11 has an annular-waveguide antenna portion 11a, which has an endless annular shape and a U-shaped section. The ring of antenna portion 11a is arranged to be parallel with cover component 10 and concentric with the central axis of reactor 1. A plurality of openings 15, 15, . . . are provided at the portion of cover component 10 opposed to annular-waveguide antenna portion 11a. The annular-waveguide antenna is composed of annular-waveguide antenna portion 11a and the portion of cover component 10 that is opposed to annular-waveguide antenna portion 11a and has openings 15, 15 . . . .

Annular-waveguide antenna portion 11a is placed at a little inner side of the inside peripheral wall of reactor 1 and arranged to be concentric with the central axis of reactor 1. An introducing portion 11b for introducing microwave into annular-waveguide antenna portion 11a is connected to an opening formed at the outside peripheral wall of reactor 1. Introducing portion 11b is arranged in the radial direction of annular-waveguide antenna portion 11a. A dielectric 14 of a fluororesin such as Teflon®, a polyethylene resin or a polystyrene resin or the like, preferably Teflon®, is fit into the inside of introducing portion 11b and annular-waveguide antenna portion 11a.

A waveguide 29 extending from a microwave oscillator 30 is connected to introducing portion 11b. The microwave oscillated by microwave oscillator 30 enters into introducing portion 11b of antenna 11 via waveguide 29. The incident wave is introduced from introducing portion 11b into annular-waveguide antenna portion 11a. The wave is propagated in dielectric 14 placed inside annular-waveguide antenna portion 11a to generate two progressive waves traveling in two directions opposite to each other. The progressive waves are combined with each other to generate a standing wave in annular-waveguide antenna portion 11a. The standing wave allows wall current to flow, which indicates maximums at certain intervals, at the inner surface of annular-waveguide antenna portion 11a.

Alternatively, a cavity may be formed in annular-waveguide antenna 11a in place of dielectric 14. However, when dielectric 14 is inserted into annular-waveguide antenna 11a, the microwave introduced into annular-waveguide antenna portion 11a has a wavelength shorter by $1/(\epsilon r)^{1/2}$ times, wherein $\epsilon r$ is a relative dielectric constant of the dielectric, depending on the material of dielectric 14. As to the current flowing on the wall, annular-waveguide antenna portion 11a with dielectric 14 has more maximum positions than that without dielectric 14, if both have the same diameter of annular-waveguide antenna portion 11a. Thus, if dielectric 14 is provided, a larger number of openings 15, 15, . . . can be formed. Such a larger number of openings allow more uniform introduction of microwave into a processing chamber 2.

Each of the positions of openings 15, 15, . . . described above has strong electric field intensity (i.e. it may correspond to loop), so that microwave can be emitted efficiently from each of openings 15, 15, . . . . The microwave emitted from openings 15, 15, . . . passes through sealing plate 4 to enter into reactor 1.

In the present invention, the arrangement of openings 15, 15, . . . is not limited to the orientation orthogonal to the traveling direction of the microwave propagated in annular-waveguide antenna portion 11a as in the above Example. The openings may be formed so as to be oblique to the traveling direction of the microwave, or to orient in the travelling direction of the microwave. The plasma generated in reactor 1 may alter the wavelength of the microwave propagated in antenna 11 to change the position having the maximum current on the peripheral wall of annular-waveguide antenna portion 11a. In such a case, the openings that are oblique to or orient in the microwave-traveling direction can absorb such variation of the maximum current position within them.

A mounting stand 3 on which a sample W is placed is provided at the center of the bottom of processing chamber 2, and is connected to a high-frequency power-supply 7 via a matching box 6. The surrounding wall of processing chamber 2 has a hole passing through it, and a gas introducing tube 5 for supplying reaction gas to processing chamber 2 is fit into the through hole. An exhaust vent 8 is also formed at the bottom wall of processing chamber 2. The gas contained in processing chamber 2 can be discharged through exhaust vent 8.

In the plasma processing apparatus described above, the surface of sample W is subjected to an etching process as follows. Processing chamber 2 is evacuated to a desired pressure through exhaust vent 8, and then reaction gas is supplied from gas introducing tube 5 into processing chamber 2. Subsequently, 2.45 GHz of microwave is oscillated by microwave oscillator 30, which is introduced through waveguide 29 into antenna 11, where a standing wave is formed at annular-waveguide antenna portion 11a. The microwave released from openings 15, 15, . . . at the lower surface of annular-waveguide antenna portion 11a passes through sealing plate 4 to enter into processing chamber 2 in which plasma is generated. A high frequency power is applied to mounting stage 3 from high-frequency power-supply 7 via matching box 6, so that the ions in the plasma is controlled while the surface of sample W on mounting stage 3 is etched.

Figure 1:
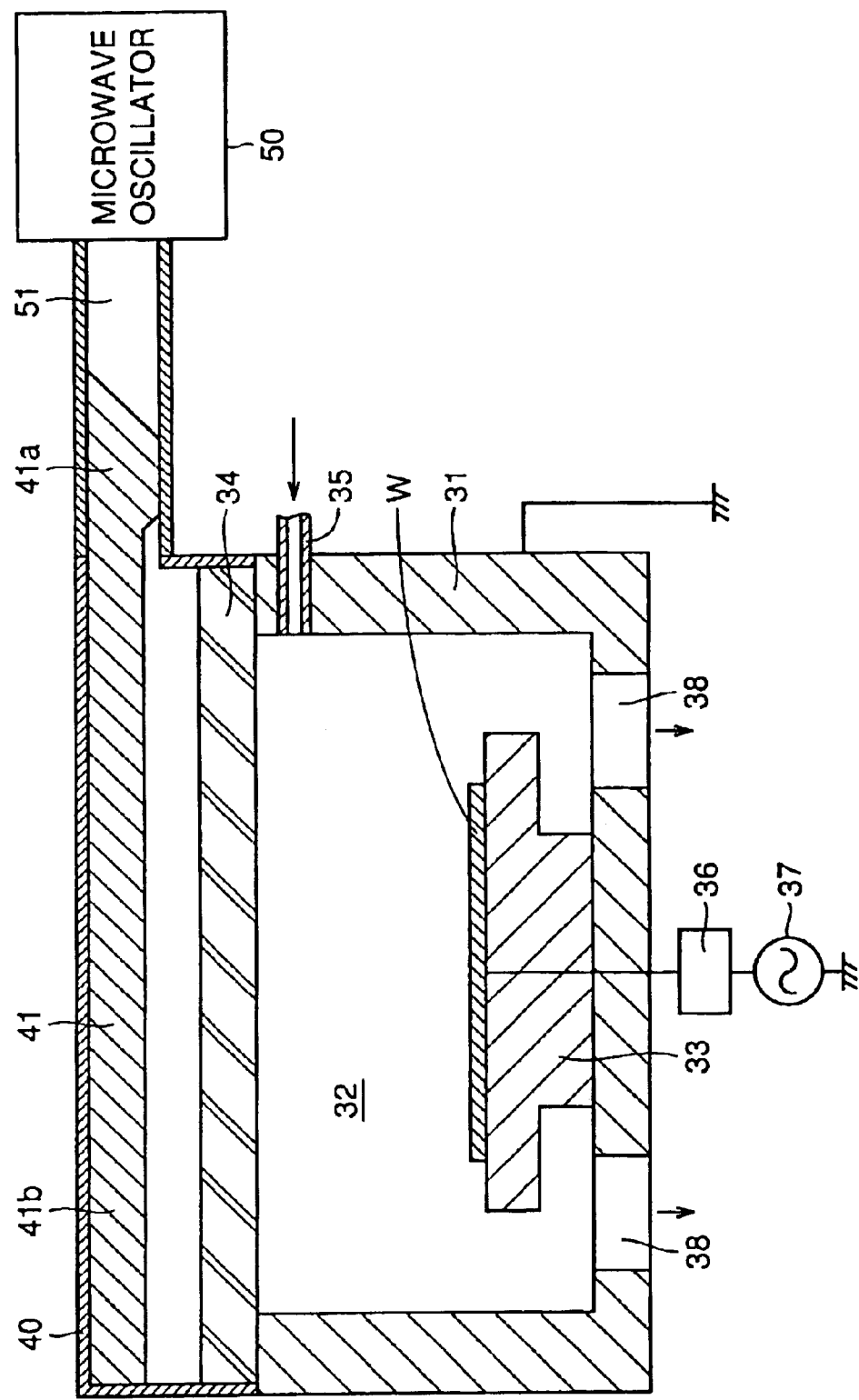
FIG. 1 is a schematic section view showing a structure of a plasma processing apparatus.
Figure 2:
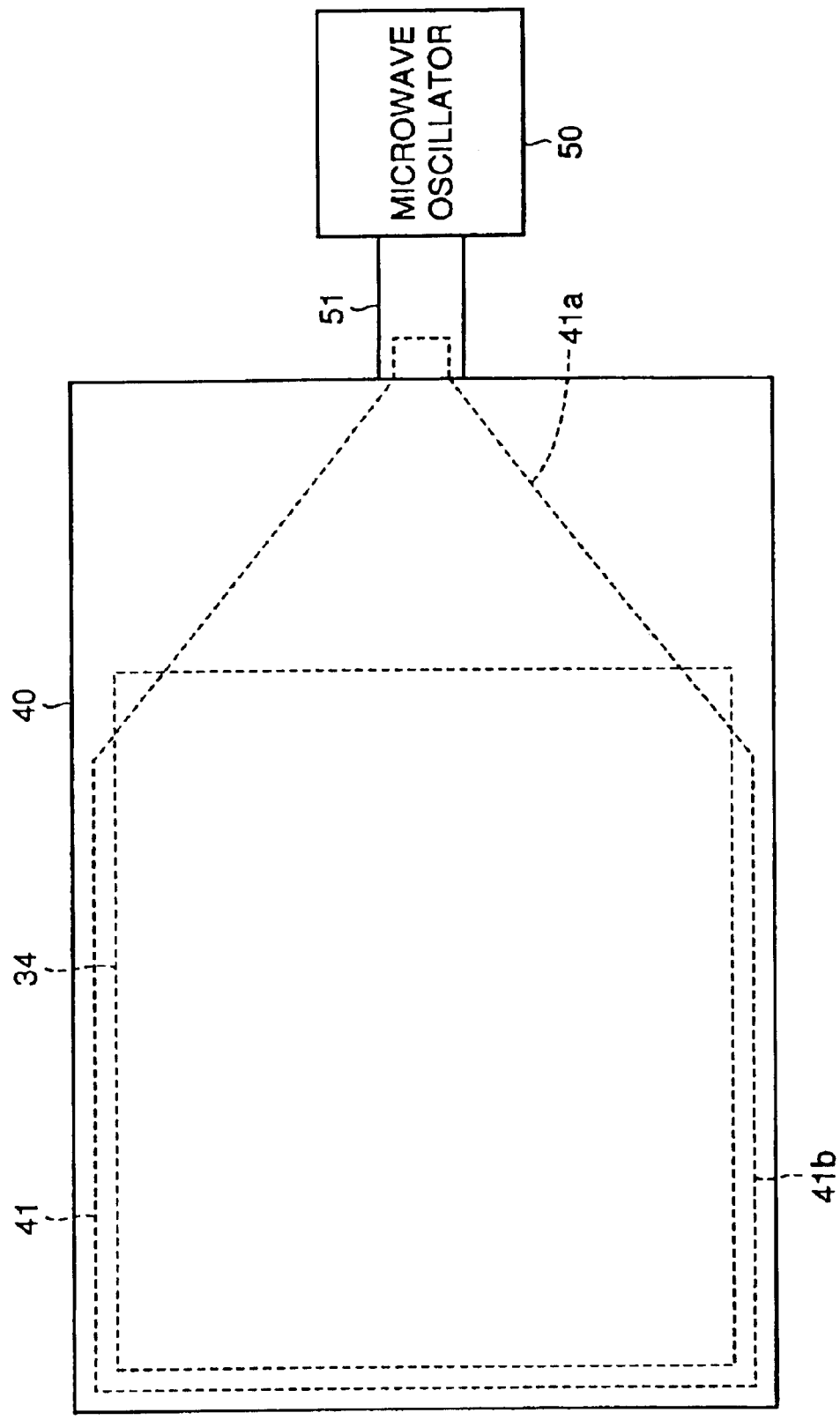
FIG. 2 is a schematic plan view of the apparatus shown in FIG. 1.

The present invention is not limited to the above-described SWP-type microwave plasma processing apparatus in which an annular-waveguide antenna is provided on sealing plate 4. According to the present invention, may also be provided another SWP-type micorwave plasma processing apparatus, such as an apparatus in which a planar dielectric line for propagating microwave is arranged opposite to a sealing plate, as shown in FIG. 1. The present invention may also be directed to a further plasma processing apparatus in which the plasma is generated by introducing electromagnetic wave into a reactor. Such a further apparatus includes an ECR-type microwave plasma processing apparatus, in which a coil is arranged around the reactor and electron cyclotron resonance is used to generate plasma, and an ICP processing apparatus.

Experiments were carried out using the apparatus described above in order to examine plasma resistance of the microwave-introducing windows. The glasses respectively forming the examined microwave-introducing windows were different in the amount of the alumina added thereto. As described above, the mass ratio of Al to Si (Al/Si) in the second glass phase and the amount ratio of the second glass phase were respectively determined by using the quantitative analysis with an energy-dispersive X-ray spectrometry and a calibration curve and by using an image of the section obtained by a scanning electron microscope. Here, the amount ratio of the second glass phase is defined as a percentage of the area of the second glass phase in a certain area of the section image obtained by the scanning electron microscope.

The microwave-introducing windows prepared as described above were used in the fluorine-containing plasma process and then the plasma-abraded amounts of the microwave-introducing windows are measured. For the measurement of the abraded amounts, polyimide tape is attached to the inner surface of the central portion of each microwave-introducing window (the surface irradiated with plasma) before the plasma processing. The tape was removed after the plasma processing and the generated step height was measured. The measured step height was converted into a relative amount of abrasion by setting the step height determined for the Al-free quartz glass (prior art example) at 1.

The plasma processing was carried out as follows. A 150-mm-diameter silicon wafer having a silicon oxide film of 1 µm in thickness formed thereon was inserted into the plasma processing apparatus equipped with the microwave-introducing window. A high frequency of 400 kHz oscillated with a power of 600 W was applied to the sample stage. $CHF_3$ gas introduced into the processing chamber, while microwave of 2.45 GHz oscillated with a power of 1300 W was introduced into the processing chamber via the window. The etching with the generated plasma for 60 seconds was repeated 5,000 times for each microwave-introducing window. That is, the plasma processing was carried out for the total of 300,000 seconds per window. The results are shown in Table 1, together with Al/Si in the second glass phase and the amount ratio of the second glass phase.

TABLE 1

| | Heating Temperature (° C.) | Al/Si | Amount Ratio of Second Glass Phase (%) | Relative Amount of Abrasion |
|---|---|---|---|---|
| Inventive Examples | 2050 | 0.01 | 30 | 0.71 |
| | 2050 | 0.22 | 58 | 0.25 |
| | 2050 | 0.40 | 67 | 0.12 |
| | 2200 | 0.40 | 67 | 0.12 |
| | 2400 | 0.40 | 67 | 0.12 |
| Comparative Examples | 2050 | 0.007 | 11 | 1 |
| | 1900 | 0 | 0 | 1 |
| Prior Art Example | 2050 | 0 | 0 | 1 |

It is apparent that the abraded amount of the microwave-introducing window decreases with increase in Al/Si or the amount ratio of the second glass phase. The table shows that a small addition of alumina and 0.007 of Al/Si bring, to the microwave-introducing window, the same amount of abrasion as the Al-free quartz glass, while 0.01 or higher of Al/Si brings, to the window, a significantly small amount of abrasion. The glass prepared through the step of melting the raw material at 1900° C. as described above also shows the same relative amount of abrasion as the prior art example.

The fQ value was measured for the glasses according to the present invention by a network analyzer at room temperature. As a result, it has been found that all the fQ values are at least 20,000 and the glasses have enough microwave transparency. The glass samples according to the present invention were used to form the microwave-introducing window. In the system equipped with the window, an oxide film formed on a silicon wafer was etched in order to examine the wafer in-plane uniformity of the etching rate. As a result, it has been found that the in-plane uniformity is at most ±5% on the all samples, and thus sufficient etching performance can be achieved.

As has been described, the glass according to the present invention has a good corrosion resistance to plasma. If the glass according to the present invention is used in the plasma processing apparatus, the abrasion of the component by plasma can be suppressed, the life of the component can be increased, the frequency of changing the component can be decreased, and therefore the manufacturing cost can be reduced. If the component according to the present invention is used as a window for a high-frequency wave or microwave in the plasma processing apparatus, the window can be prevented from being broken by heat distortion due to the high-frequency wave or microwave, and the window can have a long life. Thus the changing frequency of the component can be reduced. As compared with the conventional quartz glass, the glass according to the present invention has a significantly higher corrosion resistance to plasma, especially to fluorine-containing plasma.

What is claimed is:

1. A plasma processing apparatus for carrying out a process with plasma generated by using an electromagnetic wave, comprising:

a component made of glass, which is transparent to said electromagnetic wave and is used for introducing said electromagnetic wave into a chamber in which said plasma is generated, a cover component including a plurality of openings, into which said glass component is fitted, and an antenna fixed to said cover component, wherein said glass comprises:

a first glass phase consisting essentially of Si and O; and a second glass phase consisting essentially of Si, Al, and O, wherein said second glass phase has 0.1–10 parts aluminum-containing oxide powder added to 100 parts quartz powder.

2. The plasma processing apparatus of claim 1, wherein the second glass phase has a mass ratio of Al to Si of at least 0.01.

3. The plasma processing apparatus of claim 1, wherein said second glass phase has 1–5 parts aluminum-containing oxide powder added to 100 parts quartz powder.

4. The plasma processing apparatus of claim 1, wherein the quartz powder has a purity of at least 99.9%.

* * * * *

UNITED STATES PATENT AND TRADEMARK OFFICE
CERTIFICATE OF CORRECTION

PATENT NO. : 6,797,110 B2
DATED : September 28, 2004
INVENTOR(S) : Y. Takano and K. Terao It is certified that error appears in the above-identified patent and that said Letters Patent is hereby corrected as shown below:

Column 10,
Line 52, "powder." should read -- powder, wherein said first glass phase is substantially evenly dispersed in the second glass phase. --

Signed and Sealed this

Fifth Day of April, 2005

JON W. DUDAS
*Director of the United States Patent and Trademark Office*